United States Patent [19]
Meyer

[11] Patent Number: 5,665,633
[45] Date of Patent: Sep. 9, 1997

[54] PROCESS FOR FORMING A SEMICONDUCTOR DEVICE HAVING FIELD ISOLATION

[75] Inventor: George R. Meyer, Austin, Tex.

[73] Assignee: Motorola, Inc., Schaumburg, Ill.

[21] Appl. No.: 417,524

[22] Filed: Apr. 6, 1995

[51] Int. Cl.$^6$ ............................................. H01L 21/76
[52] U.S. Cl. ..................... 438/427; 438/692; 438/697
[58] Field of Search ................................. 437/67, 72, 63, 437/64

[56] References Cited

U.S. PATENT DOCUMENTS

| | | | |
|---|---|---|---|
| 4,679,304 | 7/1987 | Bois | 29/576 |
| 4,916,087 | 4/1990 | Tateoka et al. | 437/67 |
| 4,958,213 | 9/1990 | Eklund et al. | 357/59 |
| 4,980,311 | 12/1990 | Namose | 437/67 |
| 5,038,193 | 8/1991 | Kamigaki et al. | 357/49 |
| 5,064,683 | 11/1991 | Poon et al. | 427/39 |
| 5,073,813 | 12/1991 | Morita et al. | 357/49 |
| 5,223,736 | 6/1993 | Rodder | 257/506 |
| 5,350,941 | 9/1994 | Madan | 257/647 |
| 5,374,583 | 12/1994 | Lur et al. | 437/67 |
| 5,387,540 | 2/1995 | Poon et al. | 437/67 |
| 5,453,639 | 9/1995 | Cronin et al. | 257/510 |

FOREIGN PATENT DOCUMENTS

| | | | |
|---|---|---|---|
| 0186342 | 10/1984 | Japan | 437/72 |
| 0015944 | 1/1985 | Japan | |
| 0272745 | 11/1990 | Japan | |
| 0062946 | 3/1991 | Japan | |
| 0190663 | 7/1993 | Japan | |

OTHER PUBLICATIONS

Fazan, et al.; "A Highly Manufacturable Trench Isolation Process for Deep Submicron DRAMs"; IEDM; pp. 57–60 (1993).

Krakauer, et al.; "ESD Protection in a 3.3V Sub–Micron Silicided CMOS Technology"; EOS/ESD Symposium; pp. 250–257 (1992).

Lutze, et al.; "Poly–Buffer LOCOS and Shallow Trench Isolation Technologies for High Density Deep Submicron CMOS"; Techon '90 Extended Abstract vol.; pp. 289–292; (1990).

Wolf; Silicon Processing for the VLSI Era, vol. 2: Process Integration; pp. 17–58; (1990).

Davari, et al.; "A Variable–Size Shallow Trench Isolation (STI) Technology with Diffused Sidewall Doping for Sub-micron CMOS"; IEDM; pp. 92–95 (1988).

Rung; "Trench Isolation Prospects for Application in CMOS VLSI"; IEDM; pp. 574–577 (1984).

U.S. Pat. Appl. Ser. No. 08/393,782, filed Feb. 24, 1995; Fiordalice.

*Primary Examiner*—Trung Dang
*Attorney, Agent, or Firm*—George R. Meyer

[57] ABSTRACT

Narrow and wide, planar field isolation region (72, 74, 152, 172, 182) is formed by forming trenches (52, 54) within a substrate (10). For wide, planar field isolation regions (72, 152, 172, 182), the trenches (52) define at least one mesa (76, 150, 170, 180) within the field isolation region (72, 152, 172, 182). The trenches (52, 54) are filled with a material (62) that is polished or etched to form the planar field isolation region (72, 74, 152, 172, 182) where the wide, planar field isolation regions (72, 152, 172, 182) include the mesa(s) (76, 150, 170, 180). Etching can be used or by polishing with minimal, if any, dishing occurs because the widths of the trenches (52, 54) are kept relatively narrow (usually no more than five microns wide). Mesas (180) within a wide, planar field isolation region (182) can form linguistic characters to better identify the part number or mask set of the device. The planar field isolation region (72, 74, 152, 172, 182) can be formed near LOCOS-type field isolation regions when required for certain types of input protection circuits or high potential components.

24 Claims, 10 Drawing Sheets

PROCESS FOR FORMING A SEMICONDUCTOR DEVICE HAVING FIELD ISOLATION

FIELD OF THE INVENTION

The present invention relates to semiconductor devices, and in particular, to semiconductor devices having field isolation and processes for forming the devices.

BACKGROUND OF THE INVENTION

Many types of field isolation processes and structures currently exist. One common field isolation process is the local oxidation of silicon (LOCOS). Problems with conventional LOCOS field isolation include too much encroachment into active areas and too much of step height difference between the top of the field isolation regions and adjacent active regions. Modified versions of LOCOS (poly buffered LOCOS, sidewall masked field isolation, etc.) have been developed to reduce encroachment or reduce the step height difference but have other problems that include inducing generation of crystal defects during field oxidation, generation of substrate pits when oxidation-resistant structures are removed, increased process complexity, or the like. Modified versions of LOCOS still have at least some measurable encroachment. As used in this specification, conventional and modified versions of LOCOS field isolation regions are referred to as LOCOS-type field isolation regions.

Figure 1:
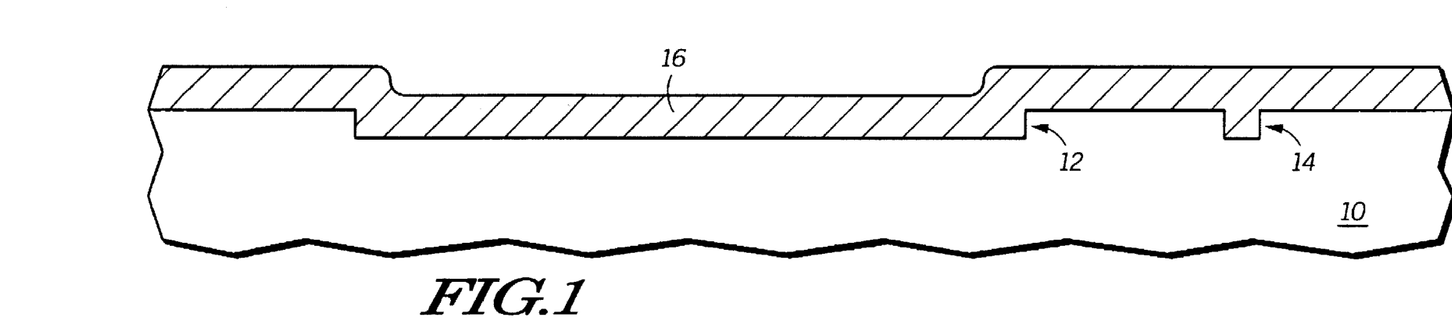
FIG. 1 includes an illustration of a cross-sectional view of a portion of a semiconductor substrate after forming trenches and an insulating layer.

Trench field isolation regions have little encroachment but large trench field isolation regions are difficult to form. FIG. 1 includes an illustration of a cross-sectional view of a portion of a substrate 10 having a wide trench 12 and a narrow trench 14 where field isolation regions are to be formed. In one embodiment, trench 12 is 10 microns or wider, trench 14 is 0.5 microns wide, and both trenches are about 4000 angstroms deep. An insulating layer 16 overlies the surface of the substrate 10 to fill the trenches 12 and 14. The thickness of layer 16 must be at least as deep as trench 14 in order for it to be completely filled. Therefore, layer 16 is at least 4000 angstroms thick.

Etching cannot be used to form trench field isolation regions for the device shown in FIG. 1 because the trench 12 is large. Isotropic etching would remove virtually all the insulating layer 16 within trench 12. Anisotropic etching would form spacers from the insulating layer 16. The spacers would lie along edges of trench 12.

Figure 2:
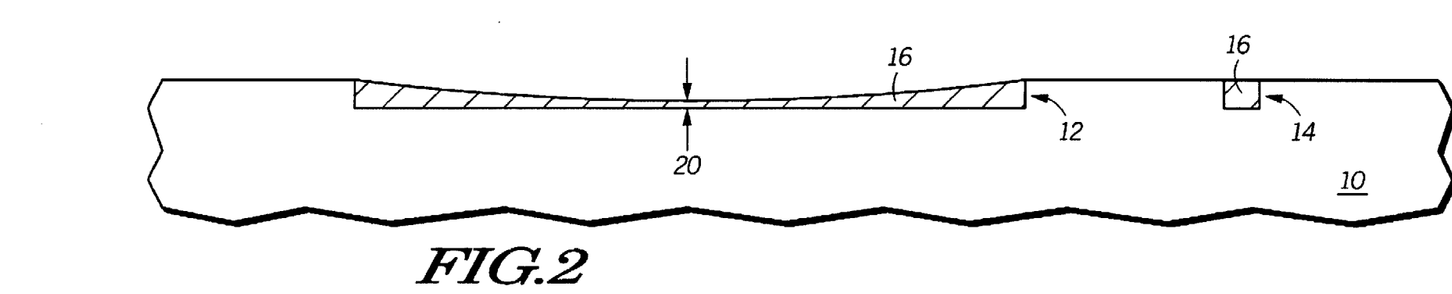
FIG. 2 includes an illustration of a cross-sectional view of the substrate of FIG. 1 after polishing the insulating layer.

Trench field isolation regions are typically formed by chemical mechanical polishing. However, chemical mechanical polishing can result in dishing as shown in FIG. 2. With dishing, more of the insulating layer 16 is removed from the center of trench 12 compared to the edges of trench 12. Referring to FIG. 2, the thickness 20 is only a fraction of the depth of the trench 12. In extreme cases, this thickness can be reduced to zero.

Hybrid LOCOS-trench field isolation regions are typically formed by steps including those used to form a conventional LOCOS field isolation process and a trench isolation process. These hybrid field isolation regions each include trenches and thick field oxide typically at least 2000 angstroms thick that is grown during a long thermal oxidation step. Besides process complexity, the hybrid field isolation regions could also have significant encroachment, crystal defects, step height differences, or the like. Simply put, hybrid LOCOS-trench field isolation regions have the problems of conventional LOCOS field isolation and additional steps from the trench isolation process. Both are undesired.

Therefore, a need exists for forming planar field isolation structures for narrow field isolation regions and wide field isolation regions on the same device without having any of the problems related to encroachment, step height differences, crystal defects, dishing, or the like.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A trench field isolation process is used to form narrow and wide, planar field isolation regions. The narrow and wide, planar field isolation regions are formed by forming trenches within the substrate. For the wide, planar field isolation region, the trench lies along a peripheral portion of the wide field isolation region and defines at least one mesa. The trenches are filled with a material that is polished or etched to form the narrow and wide, planar field isolation regions. Etching can be used to form the field isolation region because the trenches are not too wide (usually no more than five microns wide). Polishing can be performed with minimal, if any, dishing also because the trenches are not allowed to be too wide. As seen from a plan view, mesas within the field isolation region can form linguistic characters to better identify the part number or mask set of the device being formed. The present invention is better understood with embodiments described below.

Semiconductor Device with Trench Field Isolation

Figure 3:
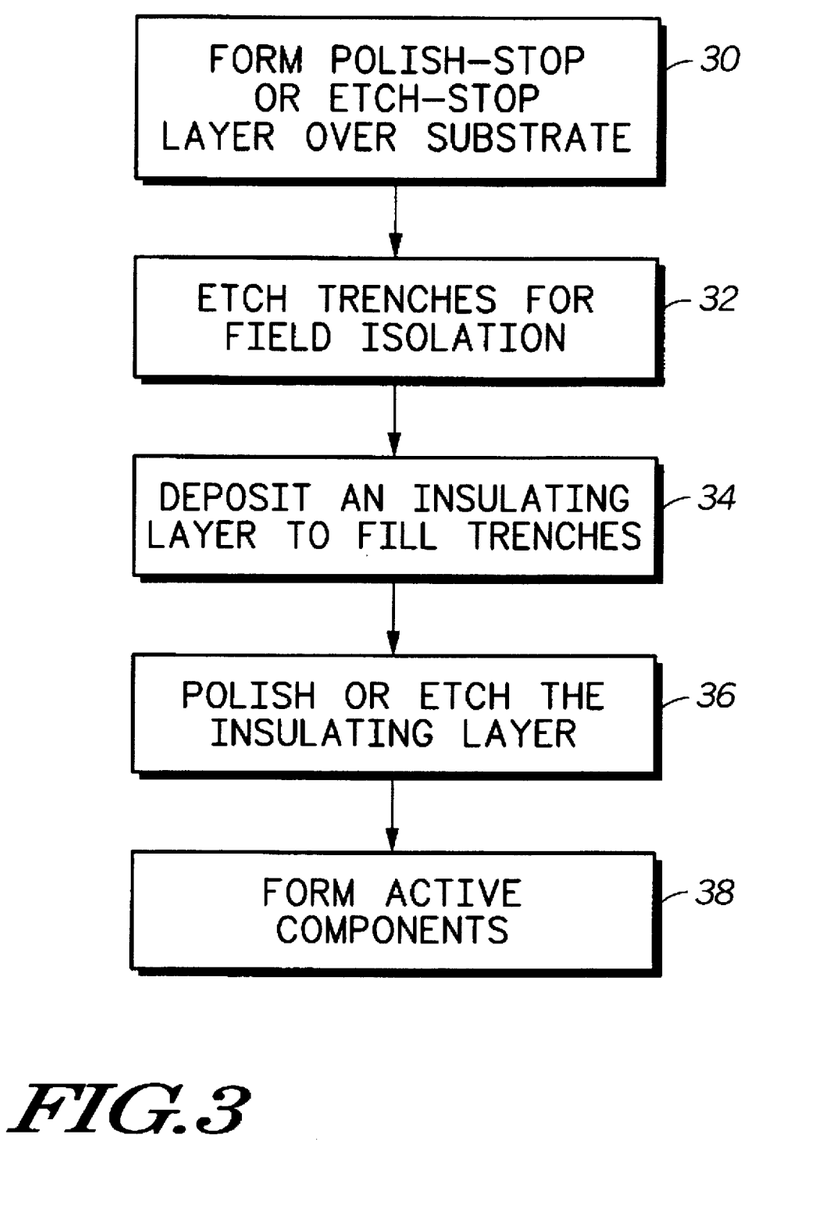
FIG. 3 includes a process flow diagram for forming field isolation regions in accordance with an embodiment of the present invention.

FIG. 3 includes a process flow diagram for forming field isolation regions in accordance with the present invention. In step 30, a polish-stop or etch-stop layer is formed over a semiconductor substrate. As used in this specification, the substrate includes a base material and any epitaxial layer, if any, overlying the base material. For example, a semiconductor substrate can include a p-type monocrystalline silicon wafer or could include an insulating base material with an epitaxial silicon, germanium-silicon, or silicon-carbide layer overlying that insulating base material. Other semiconductor substrates include germanium, germanium silicon, silicon carbide, III-V semiconductors, or the like.

In step 32, trenches are etched into the substrate for field isolation regions in step 32. An insulating layer is deposited to fill the trenches in step 34. The insulating layer is polished or etched in step 36. In step 38, active components are formed within the semiconductor substrate beside the field isolation regions.

Figure 4:
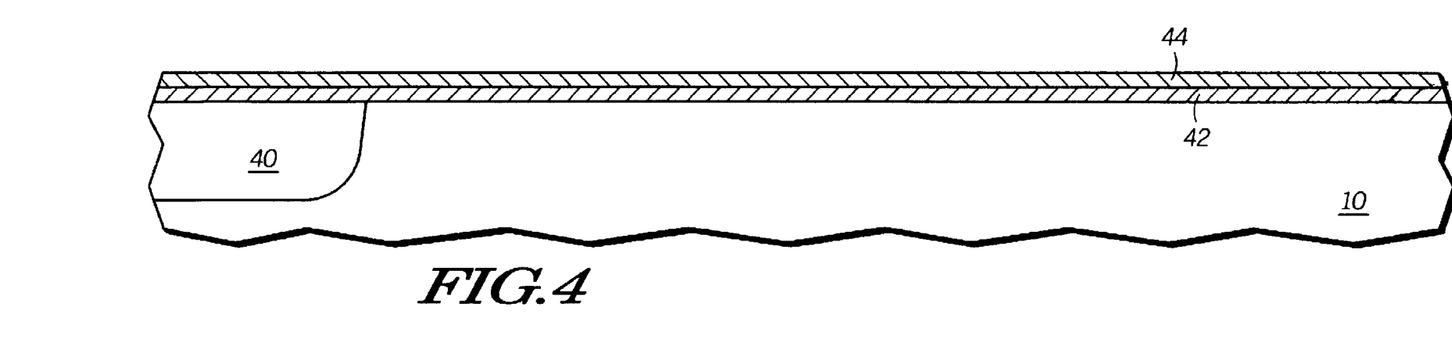
FIG. 4 includes an illustration of a cross-sectional view of a portion of a semiconductor substrate after forming a well region within and two layers over the substrate.

FIG. 4 includes an illustration of a cross-sectional view of a portion of a semiconductor substrate 10 that includes a well region 40. In this particular embodiment, the substrate 10 is a p-type monocrystalline silicon wafer and the well region 40 is an n-well region. Layers 42 and 44 are formed over the substrate 10 and n-well region 40. Layer 44 is a polish-stop layer that includes silicon nitride, boron nitride, aluminum nitride, or the like. Layer 42 is a pad layer used to promote adhesion between the polish-stop layer 44 and the substrate 10. Layer 42 typically includes oxide. Layers 42 and 44 have substantially uniform thicknesses in a range of about 100-500 angstroms each. The combined thickness of layers 42 and 44 typically does not exceed about 1000 angstroms and is usually no more than 500 angstroms.

Figure 5:
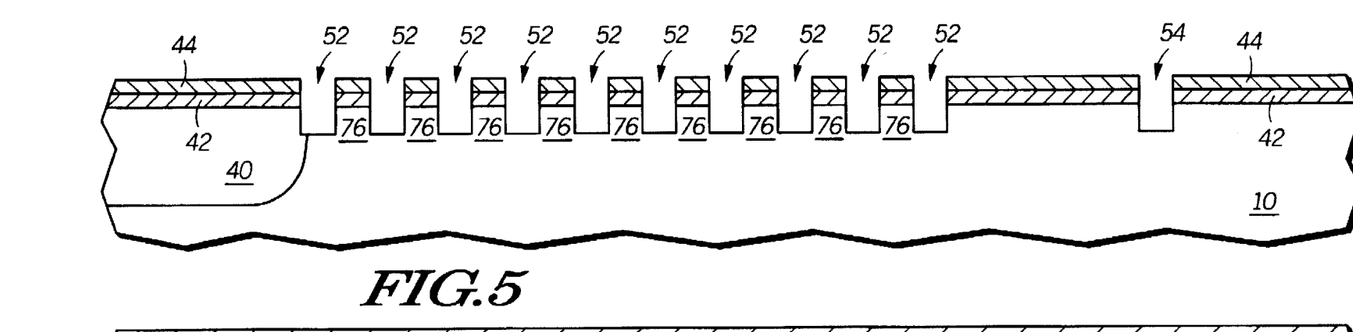
FIG. 5 includes an illustration of a cross-sectional view of the substrate of FIG. 4 after forming trenches in accordance with one embodiment of the present invention.

A resist layer (not shown) is formed and patterned over the polish-stop layer 44 to provide openings exposing portions of the polish-stop layer 44. Trenches 52 and 54 are formed by etching into the substrate 10 as shown in FIG. 5. The trenches generally have widths up to two microns and depths in a range of about 1000-3000 angstroms into the substrate. In other embodiments, the trenches can be wider or narrower. However, the trenches are usually no wider than about five microns because dishing may be too pronounced if polishing is performed. In one embodiment, trenches 52 have widths that are about the same as the width of trench 54. In another embodiment, all trenches have widths that are no wider than five times the width of the smallest critical dimension in forming the device. For example, a device formed with a 0.35 micron technology typically has its smallest critical dimension of 0.35 micron. In this instance, the trenches have widths no greater than about 1.65 microns. The resist layer is removed after forming trenches 52 and 54.

At this point in the process, the bottom or sides of the trenches 52 and 54 are doped with a channel-stop dopant. Alternatively, the channel-stop doping step is performed after the field isolation regions are formed. Channel-stop regions are not illustrated in the figures.

Figure 6:
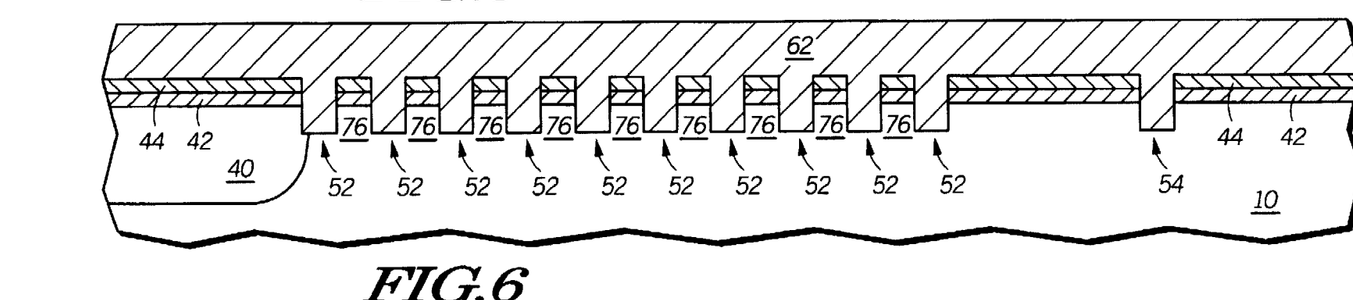
FIG. 6 includes an illustration of a cross-sectional view of the substrate of FIG. 5 after forming an insulating layer over the substrate and within the trenches.

An insulating layer 62 is formed over the substrate 10 and within the trenches 52 and 54 as shown in FIG. 6. The insulating layer 62 is a fill material and typically includes oxide or other suitable materials. The insulating layer 62 is typically formed using a relatively conformal chemical vapor deposition. The thickness of the layer 62 must be sufficient to fill the trenches 52 and 54. The thickness of the layer 62 is at least as thick as half the width of the widest trench. If the widest trench is 0.50 micron, the insulating layer can be as thin as 2500 angstroms.

Figure 7:
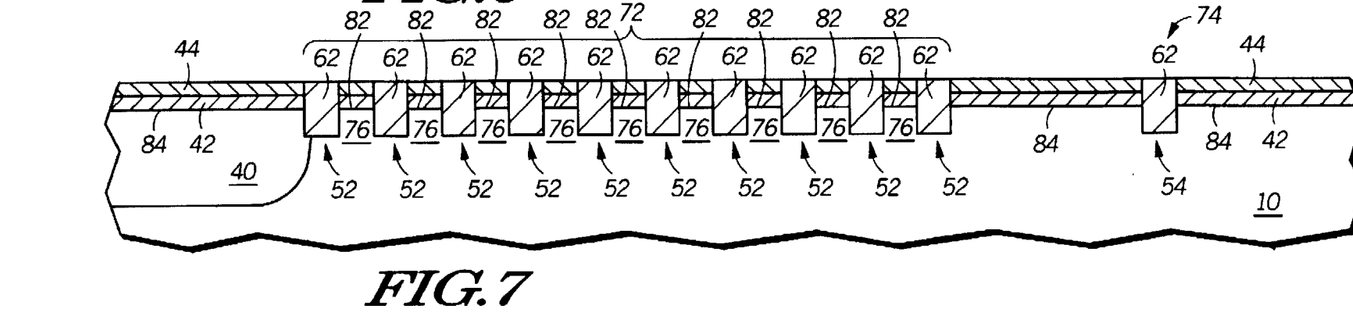
FIGS. 7 and 8 include illustrations of cross-sectional and plan views, respectively, of the substrate of FIG. 6 after polishing the insulating layer.

Insulating layer 62 is polished to remove portions of it overlying the polish-stop layer 44. After polishing, the insulating layer 62 lies within the trenches 52 and 54 as shown in FIG. 7. Note that the single large trench 12 in FIG. 2 has been replaced by the series of trenches 52 in FIG. 7. The combination of filled trenches 52 and mesas 76 form the field isolation region 72. The uppermost surfaces 82 of the mesas 76 lie at about the same elevation as the primary surfaces 84 of the substrate 10 and n-well region 40 outside the field isolation regions 72 and 74. In other embodiments, the uppermost surfaces 82 lie at elevations no lower than the primary surfaces 84. Field isolation region 74 does not include a mesa. Therefore, narrow and wide, planar field isolation regions are formed without dishing or encroachment, crystal defects, substrate pits, or the like.

Figure 8:
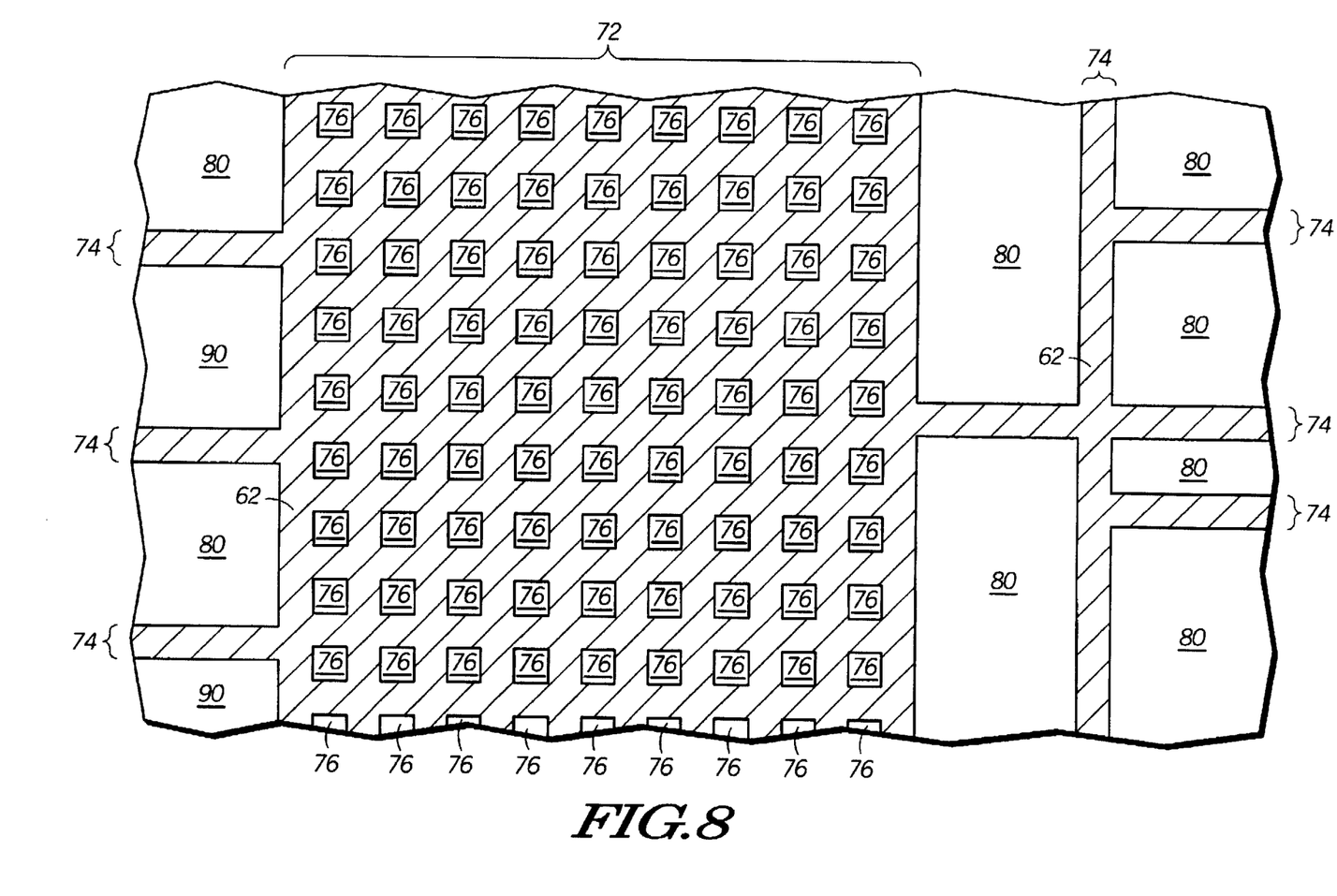

FIG. 8 includes an illustration of a plan view of the substrate at this point in processing. Layers 42 and 44 are not shown in FIG. 8 to simplify understanding. Component regions 80 and 90 lie adjacent to the field isolation regions 72 or 74. The insulating layer 62 lies along the perimeter of the field isolation region 72. The component regions 80 and 90 are portions of the substrate 10 and n-well region 40, respectively, where components including portions of transistors, capacitors, resistors, or the like are subsequently formed.

The device shown in FIG. 8 includes a large, wide, planar field isolation region 72 and narrow, planar field isolation regions 74. The field isolation region 72 is at least ten microns wide and lies between relatively distantly spaced component regions 80 or 90. The field isolation region 72 includes several mesas 76 that are laterally surrounding by the insulating layer 62 within the trenches. Usually, the mesas 76 lie no more than five microns from each other and typically less than two microns from each other. The field isolation region 74 do not have mesas 76 and lie between relatively closely spaced component regions 80 and 90. For field isolation regions 72 and 74, all points within the trenches 52 and 54 (not identified in FIG. 8) lie within two microns of its nearest mesa 76 or component region 80 or 90. When a technology less than 0.50 micron is used, the mesas may lie within one micron of each other, and all points within the trench would be within 0.50 micron of a mesa or component region.

Figure 9:
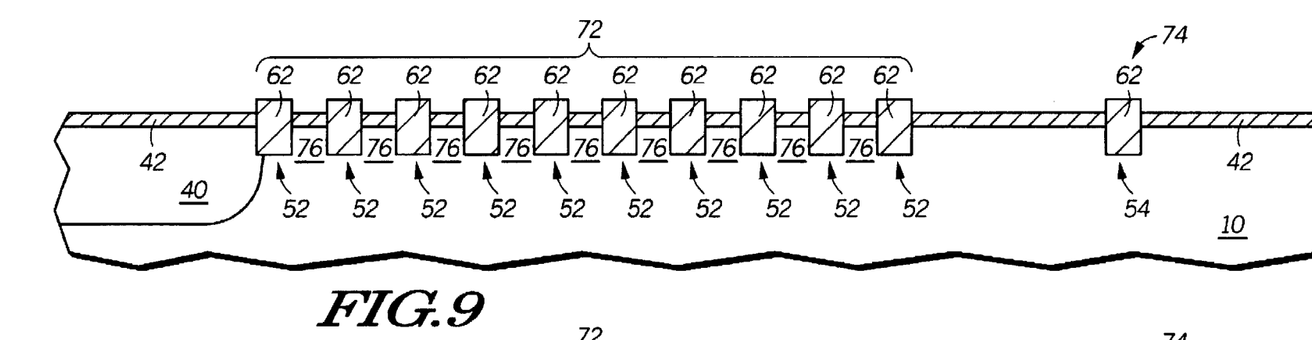
FIG. 9 includes an illustration of a cross-sectional view of the substrate of FIG. 7 after removing a polish-stop layer.

The polish-stop layer 44 is removed from the substrate as shown in FIG. 9 by plasma dry etching, wet chemical etching, or the like. The pad layer 42 is removed with or after the polish-stop layer 44. Some of the insulating layer 62 is removed with the pad layer 42 if they include the same material (i.e., oxide).

Figure 10:
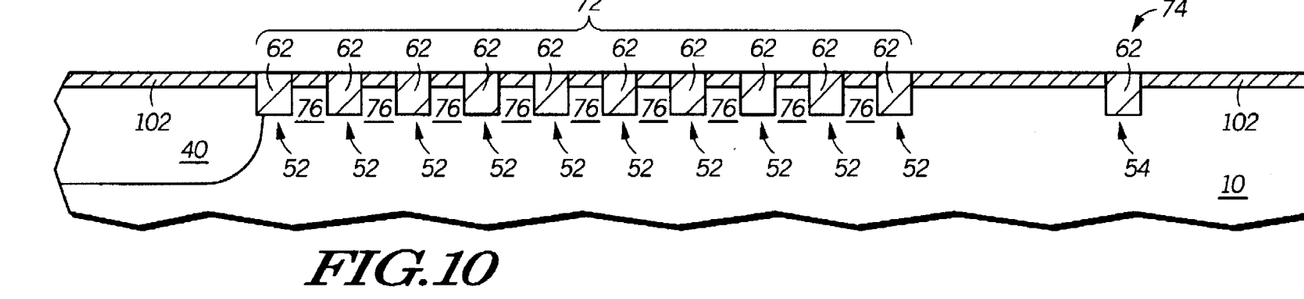
FIG. 10 includes an illustration of a cross-sectional view of the substrate of FIG. 9 after forming a gate dielectric layer.
Figure 11:
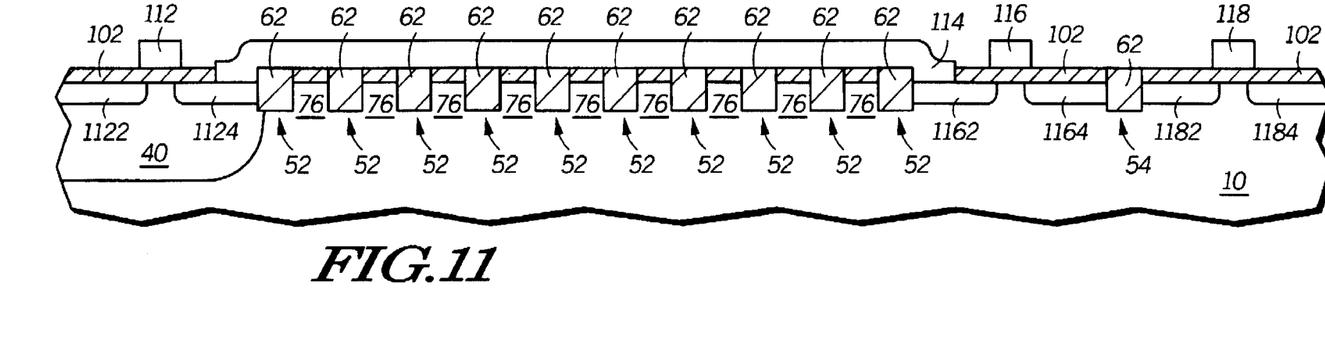
FIG. 11 includes an illustration of a cross-sectional view of the substrate of FIG. 10 after forming polysilicon gate electrodes and a local interconnect.

A gate dielectric layer 102 is formed over the substrate 10, n-well region 40, and mesas 76 within field isolation regions 72 as shown in FIG. 10. The gate dielectric layer 102 includes oxide, nitride, nitrided oxide, or the like and has a thickness in a range of about 50–300 angstroms. Gate electrodes 112, 116, and 118 and a local interconnect 114 are formed and shown in FIG. 11. The local interconnect 114 is a conductive member that overlies but does not contact the mesas 76. The local interconnect 114 lies within 500 angstroms of the mesas 76 because the gate dielectric layer 102 lies between the mesas 76 and local interconnect 114.

Figure 12:
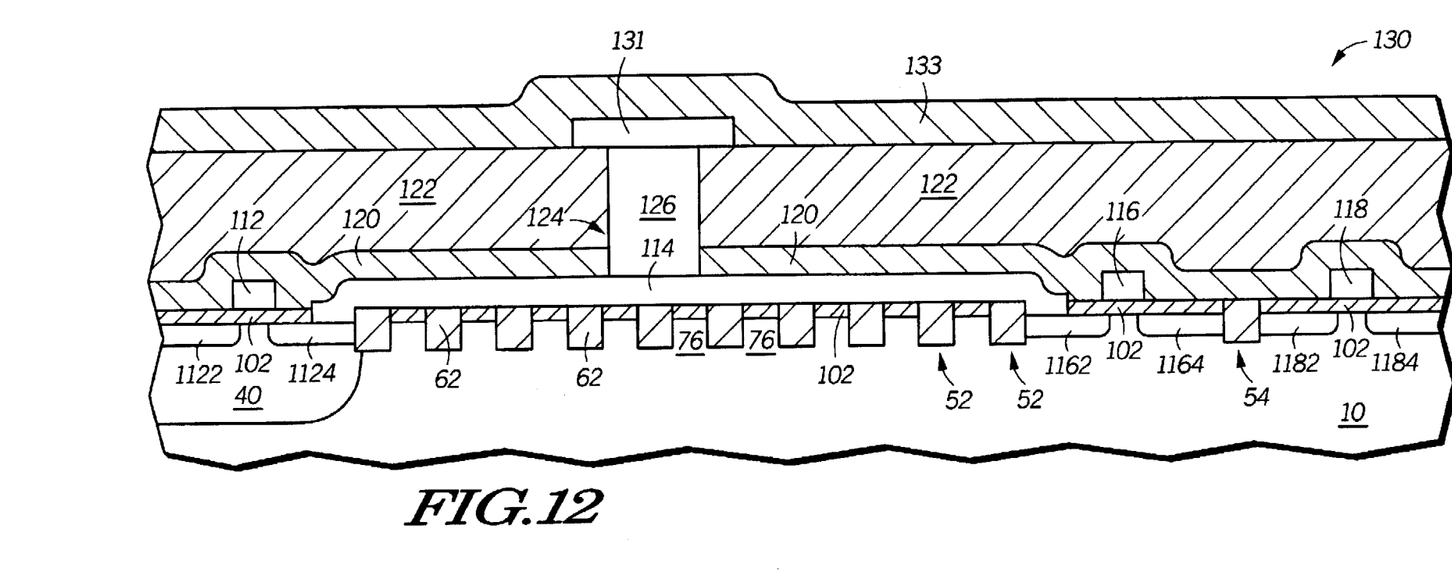
FIG. 12 includes an illustration of a cross-sectional view of the substrate of FIG. 11 after forming a substantially completed device.

Processing is continued to form a substantially completed semiconductor device 130 as shown in FIG. 12. $P^+$ doped regions 1122 and 1124, and $N^+$ doped regions 1162, 1164, 1182, and 1184 are formed within the n-well region 40 and substrate 10, respectively. The $P^+$ and $N^+$ doped regions are source/drain regions for metal-oxide-semiconductor field-effect transistors. As used in this specification, $P^+$, $N^+$, and heavily doped regions each have a dopant concentration of at least 1E19 atoms per cubic centimeter to allow the formation of ohmic contacts.

An undoped insulating layer 120 and a doped insulating layer 122 are formed over the gate dielectric layer 102, the gate electrodes 112, 116, and 118, and the local interconnect 114. The insulating layers 120 and 122 include oxide, nitride, or the like. Doped insulating layer 122 includes boron, phosphorus, or the like. The undoped insulating layer 120 is optional in some embodiments where doping from the doped insulating layer 122 is not a concern.

A contact opening 124 is formed and extends to the local interconnect 114. A contact plug 126 is formed within the contact opening 124. The contact plug 126 includes a material that is capable of being conformally deposited, such as tungsten, polysilicon, or the like. An adhesion or barrier layer, such as a titanium-containing material, a metal nitride, or the like, is part of the contact plug 126. Interconnect 131 and a passivation layer 133 are formed over the doped insulating layer 122 and contact plug 126. The interconnect 131 typically includes aluminum, copper, a refractory metal, noble metal, or the like, and the passivation layer 133 typically includes at least one nitrogen-containing layer. In a finished part, the passivation layer 133 can be covered by a polyimide layer (not shown). Other electrical connections are made within device 130 but are not shown in FIG. 12. Additional insulating layers and interconnect levels can be formed, if needed.

Alternate Embodiments

The field isolation regions 72 and 74 can be formed by etching instead of polishing. The polish-stop layer 44 is replaced by an etch-stop layer that includes, silicon nitride, boron nitride, aluminum nitride, silicon, or the like. The etch-stop layer needs to include a material that etches differently than the subsequently formed insulating layer 62. After forming the insulating layer 62, an optional reflow step can be performed to make the insulating layer more planar before etching.

The insulating layer 62 is etched to remove portions of the insulating layer that overlie the etch-stop layer. The etching step can use wet, dry, isotropic, or anisotropic etching techniques. In one embodiment, an anisotropic dry etching technique is performed that uses endpoint detection and a timed overetch. The etching forms substantially planar field isolation regions. The etch-stop layer is removed from portions of the n-well region 40 and substrate 10 where components are subsequently formed.

As a variant of the polish-stop and etch-stop embodiments, layers 42 or 44 are not required. The substrate 10 and n-well region 40 can act as a polish or etch stop if they can be polished or etched at a different rate than the insulating layer 62. A sacrificial oxidation is typically performed after the field isolation regions are formed and before components are formed. This oxidation removes polish or etch damage to the uppermost surfaces of the substrate 10 and n-well region 40 if they are used as a polish or etch stop.

A short thermal oxidation can be performed after the trenches 52 and 54 are formed and before the insulating material 62 is formed within the trenches 52 and 54. The thermal oxidation grows no more than 500 angstroms thick of oxide. In many embodiments, the thermal oxide is in a range of about 100–300 angstroms thick. The short thermal oxidation reduces the likelihood that a void forms when filling the trenches.

Figure 13:
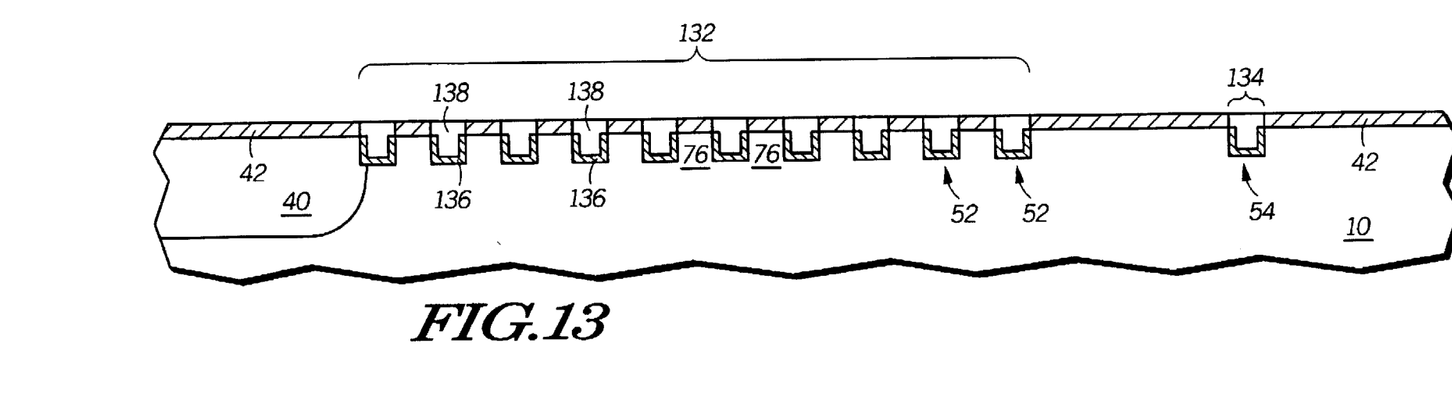
FIGS. 13 and 14 include illustration of cross-sectional views of a portion of a semiconductor substrate including field isolation regions formed in accordance with another embodiment of the present invention.

In another embodiment, the trenches 52 and 54 can be filled with a semiconductor or metal-containing material instead of the insulating layer 62 as shown previously. After forming trenches 52 and 54, exposed portions of the n-well region 40 and substrate 10 are thermally oxidized to form an oxide layer 136 having a thickness in a range of about 50–300 angstroms as shown in FIG. 13. A layer 138 that includes a semiconductor or metal-containing material is formed over the substrate 10 and within the trenches 52 and 54. Layer 138 is polished or etched to remove portions of the layer 138 that overlie layer 42 as shown in FIG. 13 to form a large field isolation region 132 and a narrow field isolation region 134.

Figure 14:
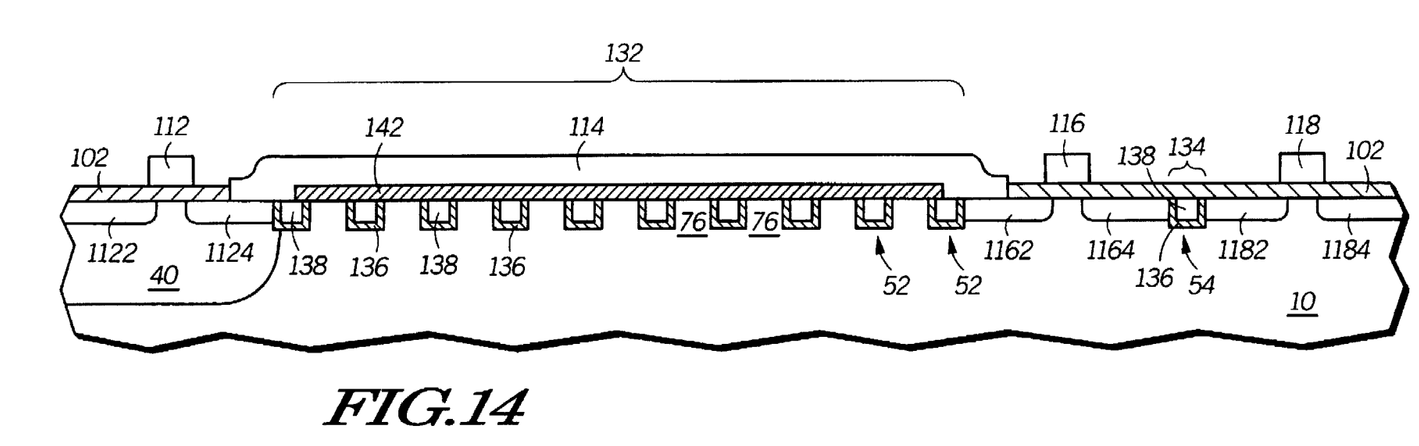

The substrate is further processed to form components as shown in FIG. 14. Layer 42 is removed and a gate dielectric layer 102 and layer 142 are formed over the substrate 10 and n-well region 40. Layer 142 includes oxidized portions of the mesas 76 and layer 138. Portions of the gate dielectric layer 102 are removed over the n-well region 40 and the substrate 10 immediately adjacent to both sides of field isolation regions 132 and 134. Gate electrodes 112, 116, 118, and local interconnect 114 are formed in a manner similar to those previously shown. Heavily doped regions 1122, 1124, 1162, 1164, 1182, and 1184 are formed adjacent to the gate electrodes 112, 116, and 118. Processing is continued to form a substantially completed device as previously described in a previous embodiment.

Figure 15:
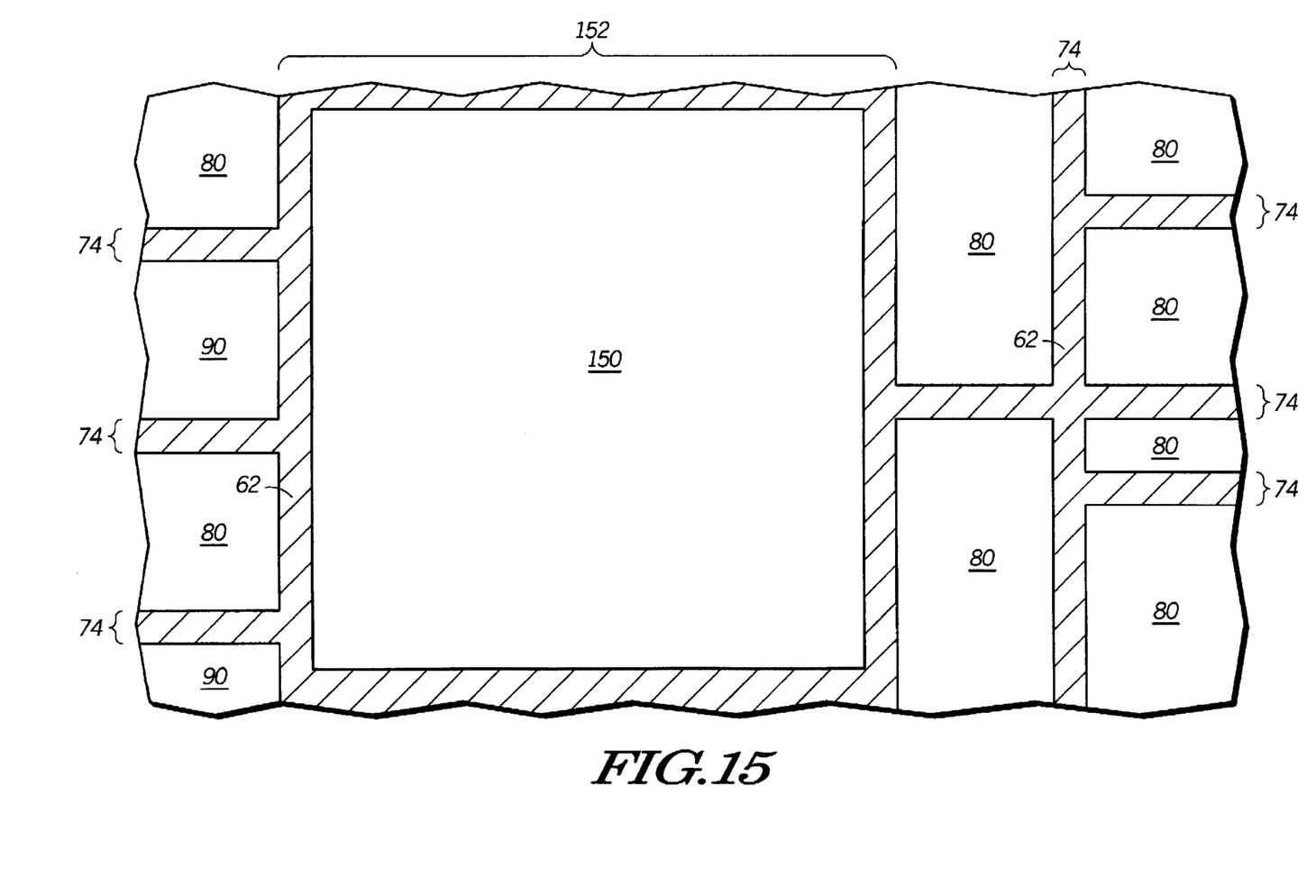
FIGS. 15 and 16 include illustrations of plan and cross-sectional views, respectively, of a portion of a semiconductor substrate including field isolation regions formed in accordance with yet another embodiment of the present invention.

In still another embodiment, a large mesa 150 lies within a large field isolation region 152 as shown in FIG. 15. In forming the large field isolation region 152, the width of the trench does not exceed the limitation previously discussed. The trenches are filled with the insulating layer 62 and polished or etched to form the field isolation regions 152 and 74.

Figure 16:
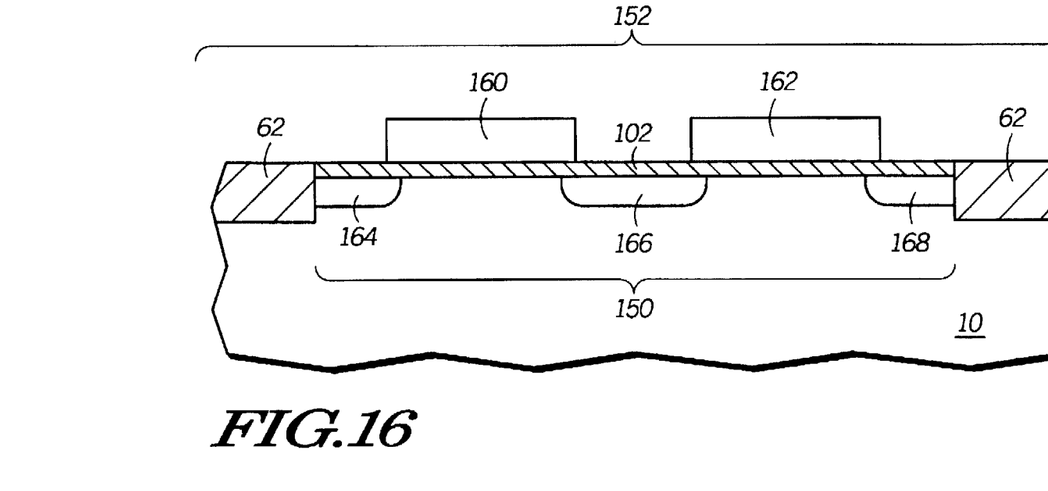

Problems are not anticipated if local interconnects 160 and 162 span the mesa 150 as shown in FIG. 16. Heavily doped regions 164, 166, and 168 are formed within mesa 150. In one example, assume the capacitive coupling between each of the local interconnects 160 and 162 and its underlying doped regions 164, 166, and 168 is ten percent. Also assume the potential on local interconnect 160 is about 3.3 volts, and local interconnect 162 and doped regions 164, 166, and 168 are electrically floating. At ten percent capacitive coupling, the potential on doped region 166 is about 0.33 volts, and the potential on the local interconnect 162 is about 0.03 volts. At 0.03 volts, the local interconnect 162 should not be mistaken by a sense amplifier or the like as being at a high potential logic state.

As an alternative, mesa 150 can be masked during heavy doping steps to prevent regions 164, 166 and 168 from being formed. Similarly, mesas 76 from a previous embodiment could also be masked during the steps when the P⁺ and N⁺ doped regions 1122, 1124, 1162, 1164, 1182, and 1184 are formed.

Many digital logic circuits operate at potentials having absolute values no higher than five volts. However, input protection circuits typically have to guard against potentials higher than nine volts because the breakdown voltage of the gate dielectric layer 102 may be about ten volts. Similarly, an analog-digital semiconductor device can operate at potentials higher than ten volts. As used in this specification, high potential components are components that are designed for potentials having an absolute value higher than $V_{DD}$, $V_{CC}$, or breakdown voltage of a gate dielectric layer, and low potential components are components that are designed for potentials having an absolute value no higher than $V_{DD}$, $V_{CC}$, or breakdown voltage of a gate dielectric layer.

For devices that include certain types of input protection circuits or high potential components, those circuits or components are formed adjacent to a LOCOS-type field isolation region, and the low potential components are formed adjacent to the planar trench field isolation regions described above. The LOCOS-type field isolation regions can be used because the input protection circuits and high potential components are typically larger than low potential components used in digital logic or memory cells and encroachment is usually not an issue or could even be desired. Still, none of the field isolation regions are hybrid LOCOS-trench field isolation regions in this embodiment.

In forming these devices having both planar trench field isolation regions and LOCOS-type field isolation regions, the planar trench field isolation regions are formed as described above adjacent to locations where low potential components are being formed. Before forming the gate dielectric layer 102, an oxidation mask is formed and patterned adjacent to locations where input protection circuits or high potential components are to be formed. The planar trench field isolation regions are covered by the oxidation mask.

A thermal oxidation is performed to form LOCOS-type field isolation regions from portions of the substrate or well regions not covered by the oxidation mask. The thermal oxidation grows about 3000–7000 angstroms thick of oxide from substrate or well regions. The trench field isolation regions and regions where low potential components are protected from the thermal oxidation by the oxidation mask. After forming the LOCOS-type field isolation regions, the oxidation mask is removed, and components or circuits are formed. Part of the LOCOS-type field isolation regions can be used a thick field oxide gate dielectric for input protection circuits.

Figure 17:
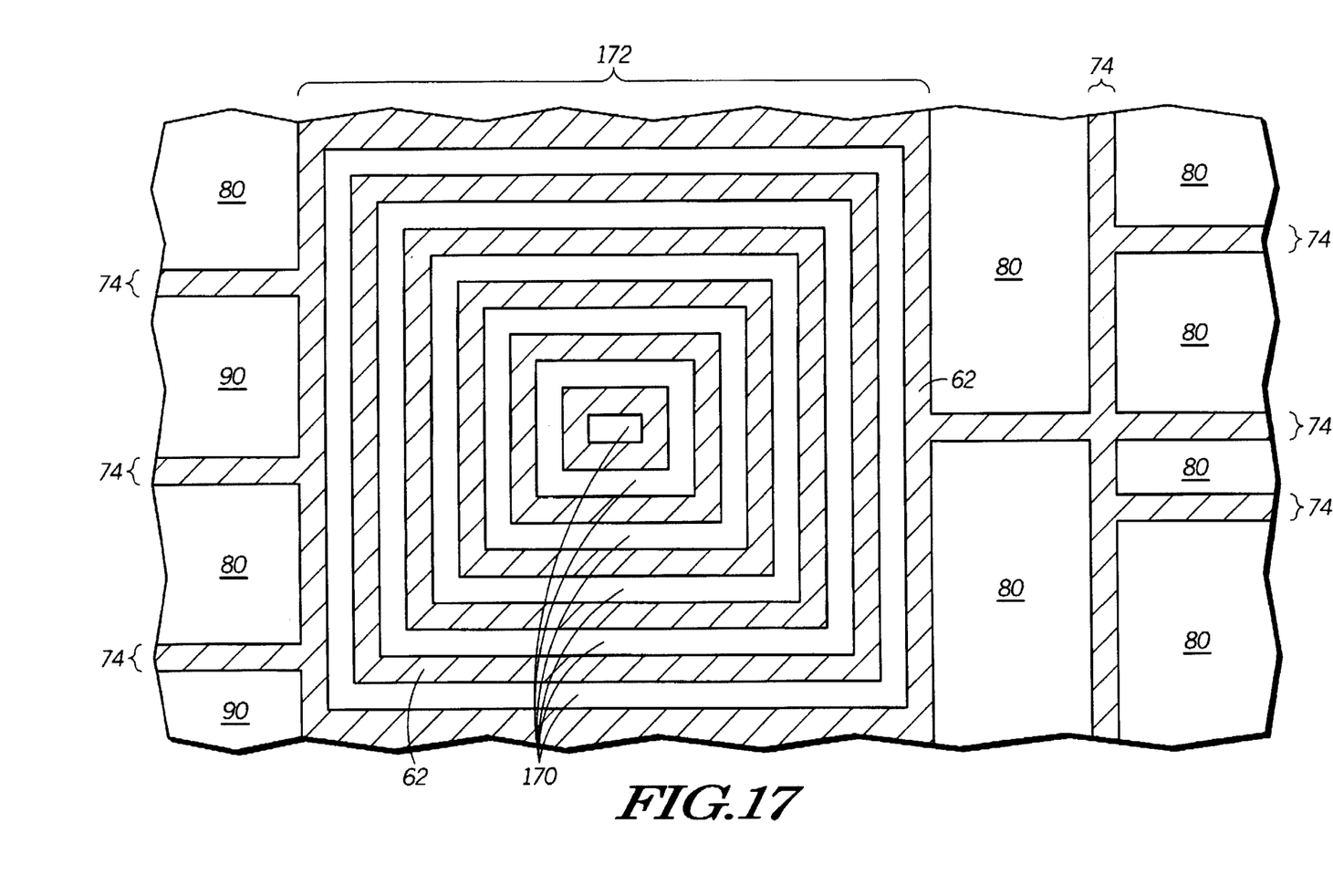
FIGS. 17 and 18 include illustrations of plan views of portions of semiconductor substrates after forming field isolation regions in accordance with still other embodiments of the present invention.
Figure 18:
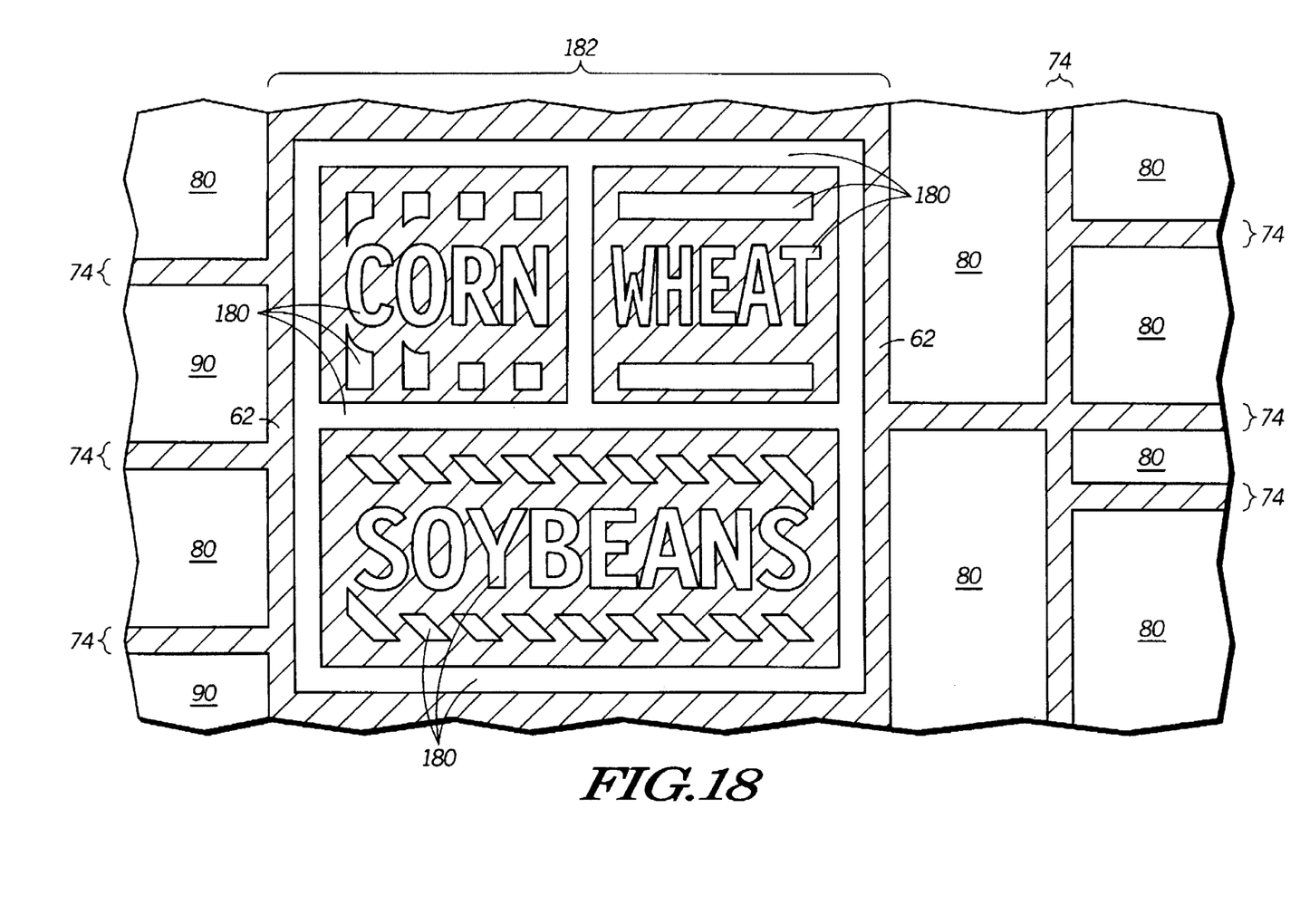

FIGS. 17 and 18 include illustrations of plan views of alternate embodiments of the present invention. In FIG. 17, the field isolation region 172 includes a set of concentric mesas 170. Other sets of concentric mesas 170 are formed in other locations but are not shown in FIG. 17. In FIG. 18, mesas 180 are formed such that, from a plan view of the device, the mesas 180 form alphabetic characters within the field isolation region 182. Besides alphabetic characters, any type of linguistic characters including konji or Chinese language characters, numerals, or the like can be used. The widths of the trenches are controlled to keep the chances of dishing low. In FIGS. 17 and 18, the mesas can have nearly any shape or width. However, the trenches are usually no wider than five microns. In FIG. 18, additional mesas 180 (other than the alphabetic characters) are present to prevent the trenches from becoming too wide.

Benefits

Wide, planar trench field isolation regions can be formed by polishing or etching. For polishing, the likelihood of dishing is decreased because no wide trenches are used. Also, etching can be used in forming wide, planar field isolation regions without removing most of an insulating layer used to fill the trenches because wide trenches are not used.

Another advantage of the present invention is the ability to use etching in forming wide, planar field isolation regions. Large capital costs are associated with having to buy a chemical mechanical polisher. Polishing is relatively new to production fabrication facilities, whereas, etching has been used for decades. Production facilities are usually more comfortable using familiar techniques as opposed to having to develop new process technologies. Many processes that work in a lab do not give acceptable yields for a production facility. Maintaining constant polishing rates over time has also been a problem with polishing.

Polishing is typically a dirty operation because of particles within polishing slurries. This can cause polishing equipment to become segregated from other portions of the fab, requiring extra space to be allocated elsewhere. The ability to use plasma etch equipment allows a relatively clean process of forming the devices without the cost or particle problems of a chemical, mechanical polisher.

Similarly, a wide, planar field isolation region can be formed without a resist-etch back process. Resist-etch back is difficult to perform because the etch rates of the resist and a trench filling material (i.e., oxide) must be kept close. The etching step used in the embodiments of the present invention etches the trench filling material without resist during the planarization step.

Higher component density can be achieved using the trench field isolation compared to LOCOS-type field isolation or field isolation using hybrid LOCOS-trench field isolation structures. The trench field isolation in accordance with the present invention has virtually no encroachment, and therefore, valuable substrate area is not wasted. Problems related to crystal defects, substrate pits, and step height differences are virtually eliminated if the planar trench field isolation regions are used.

Another benefit of the present invention is the ability to use linguistic characters in the field isolation region. Typically, lot and wafer numbers are scribed along an edge of the substrate. These numbers by themselves do not identify the part number of mask set used. The part number typically first appears on a device when an interconnect layer is patterned. However, many steps precede this step. Field isolation is typically formed early in a process and can be used to identify part numbers or mask sets. These numbers can be used to confirm that the correct masks for the part number or mask set are used. The characters can also identify the fabrication facility where the device were fabricated.

Another benefit in that the embodiments allow field isolation to be formed without the development of any new or marginal processing steps. Process integration is expected to be relatively easy.

In the foregoing specification, the invention has been described with reference to specific embodiments thereof. However, it will be evident that various modifications and changes can be made thereto without departing from the scope of the invention as set forth in the appended claims. Accordingly, the specification and figures are to be regarded in an illustrative rather than a restrictive sense.

I claim:

1. A process for forming a semiconductor device comprising the steps of:

forming a first trench within a first region of a substrate, wherein:

the first trench defines a single mesa within the first region; and the first trench has a width no greater than about two microns along opposite sides of the single mesa;

forming a fill layer within the first trench; and removing a portion of the fill layer to form a first field isolation region having a width of at least ten microns, wherein the first field isolation region has a planar surface and lies within the first region and includes a remaining portion of the fill layer and the single mesa but no other mesa.

2. The process of claim 1, further comprising steps of:

forming a dielectric layer over the first field isolation region including the single mesa; and forming a conductor over the first field isolation region, wherein the conductor lies within 500 angstroms of the single mesa within the first field isolation region.

3. The process of claim 1, wherein:

the step of forming the first trench also forms a second trench for a second field isolation region;

the step of forming the fill layer is performed such that the fill layer is formed within the second trench; and the step of removing is performed to form the second field isolation region that does not include a mesa.

4. The process of claim 1, further comprising a step of forming an etch-stop layer over the substrate before the step of forming the fill layer, wherein the step of removing is performed by anisotropically etching the fill layer overlying the single mesa until the etch-stop layer is exposed.

5. The process of claim 1, further comprising a step of forming a polish-stop layer over the substrate before the step of forming the fill layer, wherein the step of removing is performed by polishing the fill layer overlying the single mesa until the polish-stop layer is exposed.

6. A process for forming a semiconductor device comprising the steps of:

forming a first trench and a second trench within a substrate to define a first component region, wherein:

the first component region has a first side and a second side opposite the first side;

the first trench lies adjacent to the first side of the first component region;

second component region lies adjacent to the first trench on a side of the first trench opposite the first component region; and the second trench lies adjacent to the second side of the first component region and defines a plurality of mesas; and forming a fill layer within the first and second trenches to form a first field isolation region and a second field isolation region, wherein:

the first field isolation region lies at least partly within the first trench;

the second field isolation region lies at least partly within the second trench and includes the plurality of mesas; and the fill layer laterally surrounds the plurality of mesas; and removing a portion of the fill layer to form a first field isolation region within the first trench and a second field isolation region within the second trench, wherein the first field isolation region includes a remaining portion of the fill layer but no mesa, and the second field isolation region includes a remaining portion of the fill layer and the plurality of mesas.

7. The process of claim 6, wherein each of the first and second trenches has a width no wider than two microns.

8. The process of claim 6, wherein:

the step of forming the first and second trenches forms a plurality of the second trenches that define a plurality of the mesas surrounded by the second trenches; and at least some of the mesas surrounded by the second trenches have shapes such that, from a plan view, those mesas form a first symbol and a second symbol that is different from the first symbol the semiconductor device includes an identifier selected from a part number and a mask set; and the identifier includes the plurality of symbols.

9. The process of claim 8, wherein the identifier is a part number.

10. The process of claim 6, further comprising a step of forming an etch-stop layer over the substrate before the step of forming the fill layer, wherein the step of removing is performed by anisotropically etching the fill layer overlying the plurality of mesas until the etch-stop layer is exposed.

11. The process of claim 6, further comprising a step of forming a polish-stop layer over the substrate before the step of forming the fill layer, wherein the step of removing is performed by polishing the fill layer overlying the plurality of mesas until the polish-stop layer is exposed.

12. The process of claim 6 further comprising a step of forming a conductor over the second field isolation region, wherein the conductor lies within 500 angstroms of at least one mesa of the plurality of mesas within the second field isolation region.

13. A process for forming a semiconductor device comprising the steps of:

forming a trench within the substrate, wherein the trench defines a mesa;

forming a fill layer within the trench;

removing a portion of the fill layer to form a first field isolation region having a planar surface, wherein the first field isolation region includes the fill layer and the mesa; and forming a conductor over the first field isolation region, wherein the conductor lies within 500 angstroms of the mesa within the first field isolation region.

14. The process of claim 13, wherein:

the step of forming the trench forms another trench, wherein a component region lies between the trenches; and the step of forming the fill layer is performed such that the fill layer lies within the another trench, wherein a second field isolation region includes the fill layer within the another trench but does not include a mesa.

15. The process of claim 13, wherein:

the step of forming the trench defines a plurality of the mesas within the first field isolation region, wherein any one of the mesas within the first field isolation region lies within five microns of a different mesa within the first field isolation region.

16. The process of claim 13, wherein:

the step of forming the trench forms a plurality of the mesas within the first field isolation region; and at least some of the mesas within the first field isolation region have shapes such that, from a plan view, those mesas form a first symbol and a second symbol that is different from the first symbol.

17. The process of claim 13, further comprising a step of forming an etch-stop layer over the substrate before the step of forming the fill layer, wherein the step of removing is performed by anisotropically etching the fill layer overlying the mesa until the etch-stop layer is exposed.

18. The process of claim 13, further comprising a step of forming a polish-stop layer over the substrate before the step of forming the fill layer, wherein the step of removing is preformed by polishing the fill layer overlying the mesa until the polish layer is exposed.

19. A process for forming a semiconductor device comprising the steps of:

forming a plurality of first trenches within the substrate, wherein:

the plurality of first trenches defines a plurality of mesas that, from a plan view, form a plurality of symbols;

the semiconductor device includes an identifier selected from a part number and a mask set; and the identifier includes the plurality of symbols;

forming a fill layer within the plurality of first trenches; and removing a portion of the fill layer to form a first field isolation region having a planar surface, wherein the first field isolation region includes a remaining portion of the fill layer and the plurality of mesas.

20. The process of claim 19, further comprising a step of forming a conductor over the first field isolation region, wherein the conductor lies within 500 angstroms of at least one mesa of the plurality of mesas within the first field isolation region.

21. The process of claim 19, wherein the identifies is the part number.

22. The process of claim 19, wherein:

the step of forming the plurality of first trenches forms a second trench, wherein a component region lies between the plurality of first trenches and the second trench; and the step of forming the fill layer is performed such that the fill layer lies within the second trench, wherein a second field isolation region includes the fill layer within the second trench but does not include a mesa.

23. The process of claim 19, further comprising a step of forming an etch-stop layer over the substrate before the step of forming the fill layer, wherein the step of removing is performed by anisotropically etching the fill layer overlying the plurality of mesas until the etch-stop layer is exposed.

24. The process of claim 19, further comprising a step of forming a polish-stop layer over the substrate before the step of forming the fill layer, wherein the step of removing is performed by polishing the fill layer overlying the plurality of mesas until the polish-stop layer is exposed.

* * * * *

UNITED STATES PATENT AND TRADEMARK OFFICE
CERTIFICATE OF CORRECTION

PATENT NO: 5,665,633

DATED: September 9, 1997

INVENTORS: George R. Meyer

It is certified that error appears in the above-identified patent and that said Letters Patent is hereby corrected as shown below:

Column 9, line 52, before "second component", insert --a--

Column 12, line 9, change "indentifies" to --identifier--

Signed and Sealed this

Twentieth Day of October, 1998

Attest:

BRUCE LEHMAN

Attesting Officer

Commissioner of Patents and Trademarks